US006701264B2

(12) United States Patent
Caso et al.

(10) Patent No.: US 6,701,264 B2
(45) Date of Patent: Mar. 2, 2004

(54) METHOD OF AND APPARATUS FOR CALIBRATING RECEIVE PATH GAIN

(75) Inventors: Gregory S. Caso, Hermosa Beach, CA (US); Dominic P. Carrozza, Redondo Beach, CA (US)

(73) Assignee: TRW Northrop, Redondo Beach, CA (US)

( * ) Notice: Subject to any disclaimer, the term of this patent is extended or adjusted under 35 U.S.C. 154(b) by 0 days.

(21) Appl. No.: 09/918,655

(22) Filed: Jul. 31, 2001

(65) Prior Publication Data

US 2003/0028339 A1 Feb. 6, 2003

(51) Int. Cl.[7] .............................................. G06F 19/00
(52) U.S. Cl. ........................................................ 702/90
(58) Field of Search ............................ 702/90; 455/10, 455/67, 340, 552; 342/357, 126, 353, 342, 368, 352; 343/352

(56) References Cited

U.S. PATENT DOCUMENTS

| 4,941,199 | A | * | 7/1990 | Saam | ........................... 455/10 |
|---|---|---|---|---|---|
| 5,008,679 | A | * | 4/1991 | Effland et al. | ............... 342/353 |
| 5,077,561 | A | * | 12/1991 | Gorton et al. | ............... 342/359 |
| 6,134,430 | A | * | 10/2000 | Younis et al. | ............... 455/340 |
| 6,249,245 | B1 | * | 6/2001 | Watters et al. | ......... 342/357.03 |
| 6,266,007 | B1 | * | 7/2001 | Lennen | ................... 342/357.02 |
| 6,445,343 | B1 | * | 9/2002 | Pietrusiak | .................... 342/368 |
| 6,532,370 | B1 | * | 3/2003 | Underbrink et al. | ..... 455/552.1 |

* cited by examiner

Primary Examiner—John Barlow
Assistant Examiner—Tung S Lau
(74) Attorney, Agent, or Firm—McAndrews, Held & Malloy

(57) ABSTRACT

An apparatus (100), and method, for calibrating gain in satellite uplink receiver electronics includes an uplink receiver, a measurement processor, and an attenuator (106). The measurement processor receives the uplink signal from the uplink receiver and includes circuitry to sample (118) the uplink signals during a blanking interval and outputs a gain calibration signal. The sampling circuitry (118) may sample uplink signals periodically or responsive to extreme changes in conditions, and may sample the uplink signal multiple times during a blanking interval to output a multiple measurement sample. The measurement processor may include averaging circuitry (124) to produce a sample average. The method and apparatus (200) may both be used with TDMA systems.

31 Claims, 3 Drawing Sheets

METHOD OF AND APPARATUS FOR CALIBRATING RECEIVE PATH GAIN

BACKGROUND OF THE INVENTION

The present invention relates to calibration of signals in a wireless communication system. In particular, the present invention relates to calibrating receive path gain in a satellite communication system.

In many communication systems, one method of communicating involves time-division multiplexing ("TDM"). With TDM, data is ordered into regularly repeating time slots according to a data transfer standard, such as, for example, the asynchronous transfer mode ("ATM") standard. Time division multiple access ("TDMA") systems divide the radio spectrum into time slots, and in each slot only one terminal of many is allowed to transmit. Each terminal is assigned a cyclically repeating time slot, and a channel may be thought of as a particular time slot that reoccurs every N-time slot frame in a particular frequency band. The number N depends on several factors specific to each communication system and may vary widely.

TDMA systems typically transmit data in a buffer-and-burst method, thus the transmission for any terminal is noncontinuous. Therefore, unlike frequency division multiple access ("FDMA") systems (which can accommodate analog signals), digital data and digital modulation techniques are almost exclusively used with TDMA.

In a time division communication system, there are generally two types of slots, data slots and non-data slots. In this context, data slots refer to time slots in which terminals generally transmit "useful" user information. The non-data slots in this context refer to time slots containing overhead information, for example, framing information, routing information, timing information, and requests for service. A frame may include a preamble, information message (a sequence of a predetermined number of time slots), and trail bits.

When signals transmitted in an uplink arrive at a satellite, present systems use a demodulator, including an analog to digital converter ("ADC"), to process the signals. In the past, the ADCs used with such systems were unduly complicated, expensive, and power consuming, however, and had as many as nine bits of output or more. Past systems required complicated ADCs in part because a portion of the signal input to the ADC was variable gain in the receive path electronics of the satellite.

The receive path gain varies widely and is generally unknown, thereby requiring an increase in the ADC's dynamic range (and number of output bits). Thus, ADCs with as many as nine bits of output were needed to cover the total possible dynamic range of input signal levels in the face of unpredictable receive path gain.

Unfortunately, the use of an ADC with a large dynamic range results in a more complex and power consuming ADC and also adds to the number of bits that must be carried into the digital processing system downstream of the ADC. Therefore, the use of a more complex ADC increases the cost of both the ADC and the downstream digital processing system.

In a multiple access system such as a TDMA system, the dynamic range of the uplink depends primarily upon the number of transmitting terminals and the gain variation in the RF receive path (which typically includes one or more amplifiers and additional receive path electronics). The only controllable factor of these two is the receive path gain variation. Unfortunately, past wireless communication systems did not provide a method of adequately controlling the gain variation in the receive path.

Some past systems use Automatic Gain Calibration ("AGC") in attempting to alleviate some of the problems noted above. AGC does not, however, operate correctly in TDMA systems because of the dynamic loading of the input signal. In other words, the received signal power at the receiver (e.g., a satellite antenna) varies with the number of active terminals. Because the number of terminal signals simultaneously present at the input is not constant, the received signal power at the satellite antenna varies over time. As a result, the AGC circuit cannot differentiate between gain due to receive path electronics and power due to a large number of active terminals. Therefore, AGC techniques were unable to solve the problems noted above.

A need has long existed in the industry for a method of and apparatus for controlling gain variation in the receive path. Additionally, a need has long existed for a method of and apparatus for calibrating receive path gain, thereby permitting a less complex ADC to be used.

BRIEF SUMMARY OF THE INVENTION

It is an object of the present invention to reduce the required dynamic range of an analog to digital converter in a wireless communication system demodulator.

It is another object of the present invention to provide an accurate gain measurement for the receive path of a satellite uplink.

It is an additional object of the present invention to provide a gain measurement for a satellite uplink that would allow for calibration and testing of any hardware component on the satellite.

It is a further object of the present invention to provide an improved analog to digital converter for use with demodulators in wireless communication systems.

It is yet another object of the present invention to enable a reduced complexity analog to digital converter to be used with demodulators in satellite communication systems.

It is a further object of the present invention to reduce the number of bits carried in the digital processing system downstream of an ADC.

It is a still further object of the present invention to calibrate receive path gain using an uplink signal without loss in bandwidth.

One or more of the preceding objects, or one or more other objects which will become plain upon consideration of the present specification, are satisfied, at least in part, by the invention described herein.

One aspect of the invention, which satisfies one or more of the above objects, is an apparatus for calibrating gain in satellite uplink receiver electronics. The apparatus includes an uplink receiver, a measurement processor, and an attenuator. The uplink receiver receives a satellite uplink and outputs an uplink signal to the measurement processor.

The measurement processor receives the uplink signal and includes circuitry to sample the uplink signal during a blanking interval (i.e., during a period of no transmission over the uplink, such as an empty slot or an empty time probe slot 306a in a TDMA uplink structure).

The measurement processor may connect to a snapshot buffer and include logic to sample the uplink signals periodically (e.g., approximately every thirty minutes) and may sample the uplink signals responsive to extreme changes in conditions). The measurement processor may also include circuitry that samples the uplink signals multiple times during a blanking interval to produce a multiple measurement sample (e.g., a sample average).

The measurement processor outputs a gain calibration (e.g., a sample average) which the attenuator uses to attenuate or calibrate the uplink signal to produce a calibrated signal. The attenuator may be, for example, a variable attenuator responsive to a gain calibration signal.

The apparatus may thereby use a lower complexity ADC coupled to the calibrated signal. The converter may have approximately 42 dB of dynamic range, for example, corresponding to 7 bits or less of output.

Another aspect of the invention is a method for calibrating gain in satellite uplink receiver electronics to reduce the dynamic range of the received uplink signals. The method includes the steps of receiving an uplink signal during a scheduled blanking interval, measuring gain associated with the blanking interval, and generating a calibrated signal by responsively controlling a variable attenuator in accordance with the measured gain. The method may sample the uplink signals periodically (e.g., every thirty minutes) and may sample the uplink signals responsive to extreme changes in conditions. The method may also include taking multiple samples during a blanking interval and averaging the multiple samples.

DETAILED DESCRIPTION OF THE INVENTION

Figure 1:
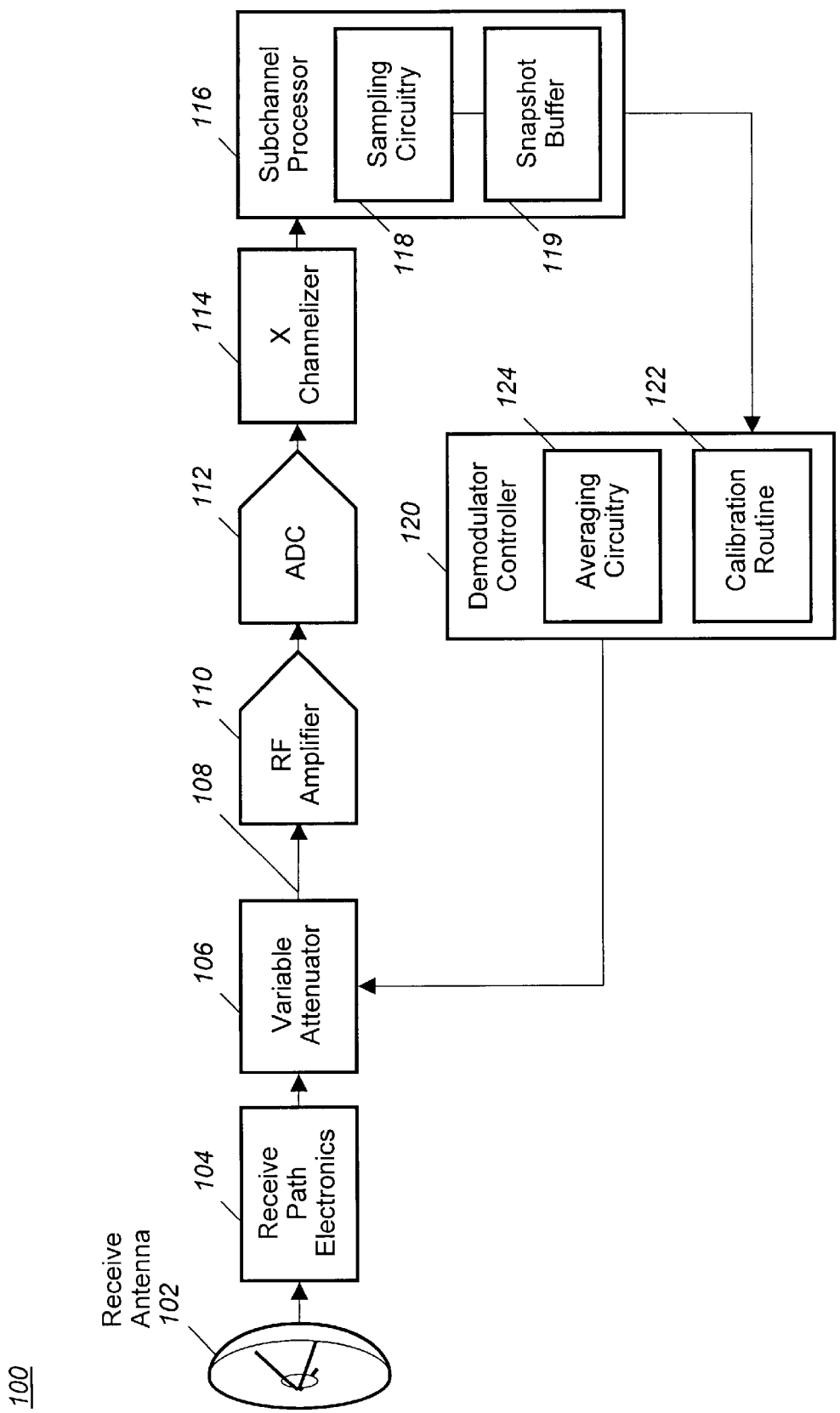
FIG. 1 shows a block diagram of an apparatus for calibrating gain in satellite uplink receiver electronics according to a particular embodiment of the present invention.
Figure 2:
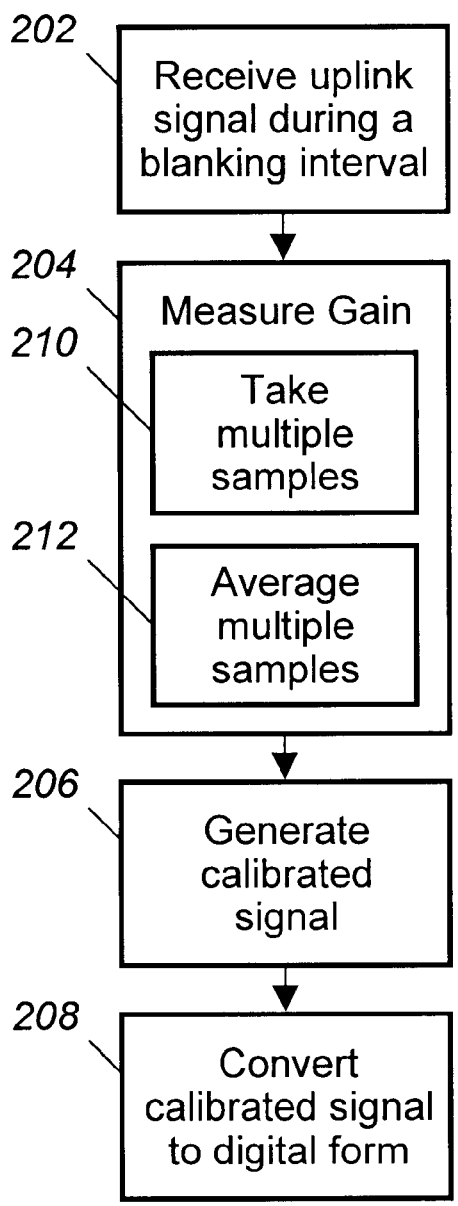
FIG. 2 presents a method of calibrating gain in satellite uplink receiver electronics according to a particular embodiment of the present invention.
Figure 3:
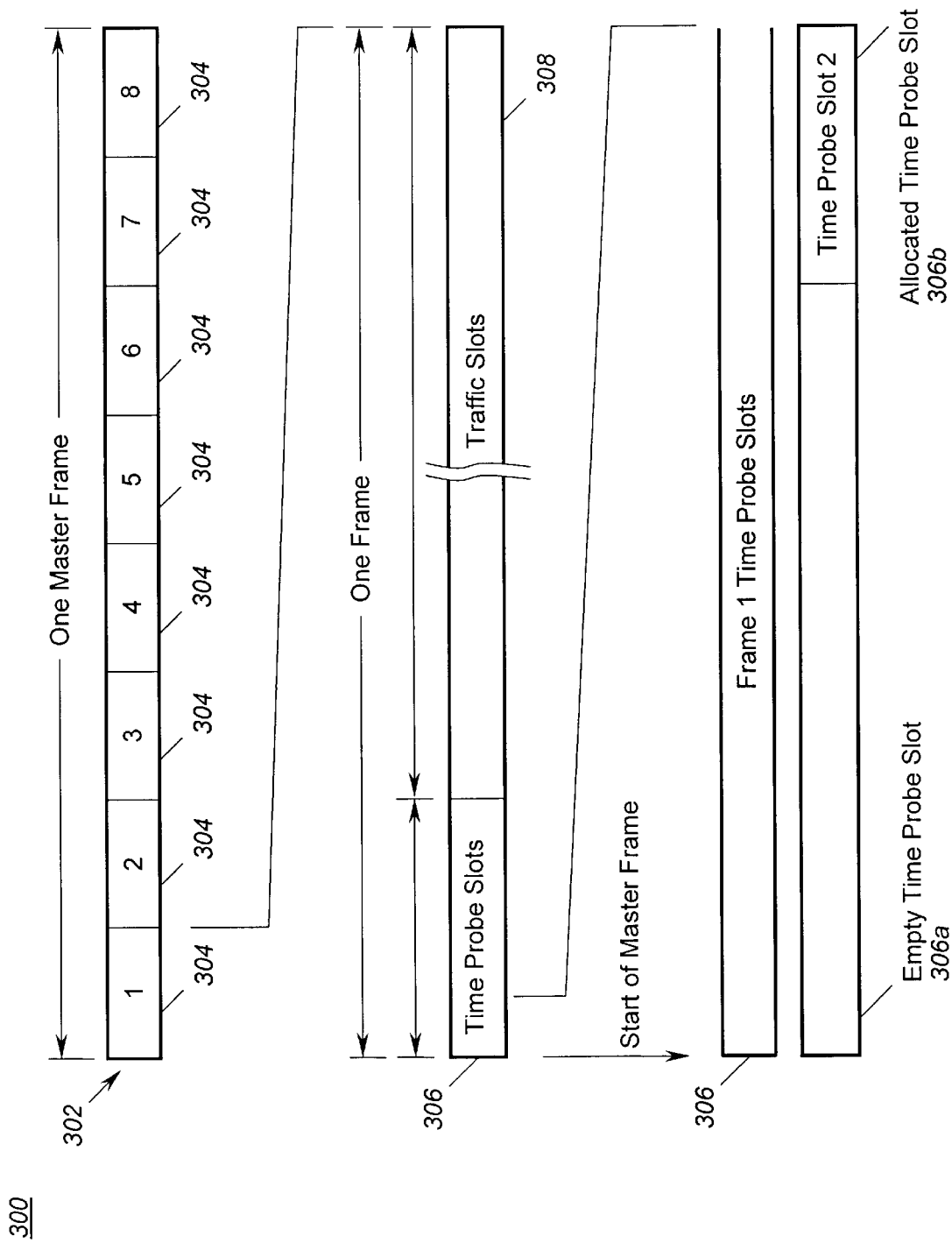
FIG. 3 is a data chart showing the TDMA structure in a satellite uplink.

The apparatus 100 illustrated in FIG. 1, method shown in FIG. 2, and data chart 300 of FIG. 3 correspond to one another at several points. Accordingly, FIGS. 1, 2 and 3 will be discussed together after being introduced immediately below.

Turning now to FIG. 1, that figure presents an apparatus 100 for calibrating gain in uplink signals received at a satellite receiver. The apparatus 100 includes a receive antenna 102, receive path electronics 104, and a variable attenuator 106. A calibrated signal output 108 is also shown. The apparatus 100 also includes an RF amplifier 110, an analog to digital converter 112, and an X channelizer 114. Also shown are a sub-channel processor 116 and corresponding sampling circuitry 118 and a snapshot buffer 119. A demodulator controller 120, a calibration software routine 122, and averaging circuitry 124 are also shown.

Turning now to FIG. 2, that figure shows a flow chart 200 of a method for calibrating gain in satellite uplink receiver electronics. The method includes a receive uplink signal step 202, a measure gain step 204, and a generate calibrated signal step 206. Also shown is a conversion step 208. The measure gain step 204 may further include the sampling step 210 and averaging step 212.

Turning to FIG. 3, that figure is a data chart 300 showing time slots in a satellite uplink. The masterframe 302 shown includes eight frames 304. Frame one 304 is expanded to show time probe slots 306. The time probe slots 306 are further expanded and empty 306a and allocated 306b time slots are shown. Traffic slots 308 are also shown.

Returning to FIG. 1, at the satellite, the receive antenna 102 receives the satellite uplink and transmits the uplink signal to the receive path electronics 104. The receive path electronics 104 may include, for example, one or more amplifiers and may also include tuners, mixers, and filters. The receive path electronics 104 may perform operations on the uplink signals including, for example, amplification. The receipt of the uplink signal by the receive antenna 102 and the receive path electronics 104 corresponds to the receive uplink signal step 202 of FIG. 2.

In the illustrated embodiment, the receive path electronics 104 provide the input signal to the variable attenuator 106, which, in turn, provides a calibrated signal output 108 through the RF amplifier 110 to the ADC 112.

The ADC 112 converts the signal from analog to digital format through methods including, for example, flash conversion or successive approximation conversion. After passing through the ADC 112, the signal is in digital format and may be operated on by a variety of subsequent digital processing components such as, for example, CPUs, error correction coders, and the like. For example, in the illustrated embodiment, the digital signal is sent through the X channelizer 114, which may be implemented as a bank of filters that separate the signal into frequency sub-channels.

Regardless of whether an X channelizer 114 or other digital components are present, the sampling circuitry 118 (which may be one of a series of sampling circuits for a series of corresponding sub-channels) then takes a "snapshot" of the data coming out of the ADC 112 or other component and stores the snapshot in the snapshot buffer 119. Preferably, the snapshot is taken during periods where there is no transmission over the uplink, i.e., during blanking intervals, for reasons that will be discussed below. Although not required, in the preferred embodiment there is one sampling circuit 118 associated with the sub-channel processor 116 for each sub-channel (i.e., each frequency channel). The sampling circuitry 118 in the illustrated embodiment is located in the sub-channel processor 116, but this is not required. The sampling circuitry 118 controls the storage of snapshots in the snapshot buffer 119.

The demodulator controller 120 then reads the snapshot and submits it to the calibration routine 122. The calibration routine 122 runs on the demodulator controller 120 and may perform, for example, an averaging operation on the snapshot. Alternatively, averaging circuitry 124 may be used to perform an averaging operation on the snapshot. The operations performed by the sampling circuitry 118, demodulator controller 120, and calibration routine 122 correspond to the measure gain step 204 of FIG. 2.

Based on the snapshot data, the demodulator controller 120 and the calibration routine 122 determine how much unwanted gain is present in the receive path electronics 104. The amount of unwanted gain may be determined, for example, by determining the measured power level or by comparing the measured power level with a reference level. The reference level may be, for example, a predetermined threshold or a prior power measurement. The demodulator controller 120 and calibration routine 122 may determine the amount of unwanted gain using one snapshot or several snapshots. If several snapshots are used, the snapshots may be averaged as noted above to provide a more representative gain measurement.

The proper gain calibration setting, i.e., the one that will result in removal of the unwanted gain, is then sent to the variable attenuator 106 by either the demodulator controller 120, calibration routine 122, or both. With the gain calibration setting, the variable attenuator 106 removes the proper amount of gain from subsequent input signals (e.g., the traffic slots 308) received by the receive path electronics 104.

As a result, a gain measurement and gain calibration of any hardware component on the satellite, including components in the receive path electronics 104, may be made. Preferably, the gain measurement and calibration are performed for gain attributable to components disposed between the receive antenna 102 and the ADC 112. Additionally, in this manner, a gain calibration is performed for any gain attributable to the receive antenna 102. The gain calibration described above corresponds to the generate calibrated signal step 206 of FIG. 2.

As a result of the calibration, the dynamic range of the uplink signals for which the gain is calibrated is reduced before the uplink signals are processed by the ADC 112. Accordingly, the required dynamic range of the ADC 112 (i.e., the output range required of the ADC 112) is reduced. Because the dynamic range of the ADC 112 is reduced, the ADC 112 may use fewer output bits. In other words, recognizing that each bit in an ADC 112 typically covers a finite number of dB of dynamic range (e.g., 6 dB), when the calibration reduces the required dynamic range the ADC 112 requires fewer output bits. As an example, the present invention reduces the dynamic range by approximately 6–17 dB, thereby eliminating as many as two ADC output bits.

Note, however, that because the calibration results in a smaller required dynamic range, the ADC 112 may still achieve the same resolution as if it had the greater number of output bits. On the other hand, if an ADC having a smaller number of output bits were used without the present gain calibration the ADC would not sufficiently cover the dynamic range of the uplink. In such a case, clipping (distortion) of the uplink signal or overloading of the ADC might result.

Furthermore, by reducing the number of bits in the ADC 112, the cost of producing the ADC 112, the complexity of the ADC 112, and the power consumption of the ADC 112 are reduced. Additionally, the number of bits that must be processed by and therefore the cost of the digital processing system downstream of the ADC 112, for example the X channelizer 114, is also reduced. A lower complexity, more cost effective, and more power efficient system may thereby result.

Gain variations are introduced into the uplink signal in the receive path electronics 104, for example in one or more amplifiers. Gain variations may also be introduced as a result of the receive path electronics 104 passing into and out of the earth shadow and being heated or cooled by solar rays or the lack thereof. Additionally, gain variations may be introduced if the angle at which the sun's rays contact the receive path electronics 104 changes or if the receive path electronics 104 are shielded from the sun by another part of the satellite or other object. Because the gain variation may be a result of slowly occurring phenomena, for example the receive path electronics 104 passing into the earth's shadow, it is anticipated that a gain measurement made once every thirty minutes will produce representative gain variation measurements. One skilled in the art will readily appreciate, however, that gain measurements may be taken at any interval and may further depend on how quickly the gain varies in any particular environment. For example, if an extreme change in conditions occurs, i.e., any phenomena that causes a large or sudden change in the receive path gain, additional gain measurements may be taken.

The apparatus 100 may be used with a wide variety of demodulators including, for example QPSK, BPSK, FSK and N28 Quam demodulators. Additionally, the apparatus 100 may be implemented with any signaling standard that may introduce a blanking interval. Such standards include, for example, TDM, TDMA, CSMA (carrier sense multiple access), and the like.

As stated above, the benefits of measuring the receive path gain during a blanking interval will now be discussed. In general, when the sampling circuitry 118 or other gain measuring device measures the gain from the receive path of the satellite, it is important that the gain measuring device know what is transmitted over the uplink in order to produce accurate results.

If, for example, the gain measuring device attempts to measure power in a data time slot, the gain measuring device cannot know what it is measuring; in other words, the device does not know what portion of the power is attributable to receive path gain and what portion is attributable to the data transmission(s). The power attributable to the data transmission(s) is unknown because the device does not know how many terminals are transmitting over the uplink at a given time. As a result, any gain measurement is likely to be an inaccurate measure of the true gain.

If, however, the gain measurement is made during a blanking interval, such as, for example an empty time probe slot 306a in a TDMA system, the gain measuring device can measure the gain with much greater accuracy. A time probe slot 306 is a type of "non-data" slot used with a TDM or TDMA system that typically contains framing information, routing information, timing information, and/or requests for service. The receive path gain measurement of an empty time probe slot 306a is accurate because no data or other information is transmitted at that time. Specifically, the power detected for the blanking interval is primarily attributable to noise at the receive antenna 102 and gain in the satellite receive path. As a result, a more accurate receive path gain measurement may be made. Additionally, to account for variations in gain over time, a new gain calibration setting may be computed periodically.

Which time probe slots are kept empty may be set, for example, by a network control center on the ground. Through timing information, the timing of the blanking intervals is transmitted to the satellite so that the sampling circuitry 118 will know when to measure the receive path gain.

Preferably, in a FDM/TDMA system, for example, no data is transmitted over any frequency channel during the blanking intervals, so that interference between multiple sub-channels (i.e., frequency channels) is kept to a minimum. If the sub-channels have time slots that vary in length, more blanking intervals may be used in some frequencies than are used in other frequencies. If, for example in a FDM/TDMA system, one time probe slot of the frequency channel with the longest time slot is kept empty, that time period may correspond to five or twenty-five time slots of another frequency channel, for example.

Again referring to TDMA systems in which time probe slots 306 are used, although the length of the longest frequency channel time slot may be the empty time probe slot 306a, the measurement of the gain may occur in a shorter period of time than the duration of the empty time probe slot 306a.

Referring generally to FIG. 1, the attenuator 106, ADC 112, sampling circuitry 118, and calibration routine 122 may be implemented using combinatorial logic, an ASIC, through software implemented by a CPU, a DSP chip, or the like. Additionally, the foregoing hardware elements may be part of hardware that is used to perform other operational functions at the receiving satellite. The gain measurements, gain calibration settings, and timing information may be stored in registers, RAM, ROM, or the like, and may be generated through software, through a data structure located in a memory device such as RAM or ROM, and so forth.

In an oversubscribed uplink there may be a slight reduction in the total number of terminals that may be in the system. This is because, in an oversubscribed uplink, there are more subscribed terminals than can transmit over the uplink at one time. The ratio of the number of terminals to the number of channels is based on statistical multiplexing (i.e., based on the fact that not every terminal will place a call at the exact same time), and may be for example, four-to-one. Even when terminals are not transmitting, however, each terminal is assigned a time probe slot 306. Thus, there may be, for example, four times as many time probe slots as there are data slots. Because time probe slots 306 can be allocated to be empty with the present apparatus 100 and method, there may be a slight overall loss in the number of terminals that can subscribe. There is no corresponding reduction in the number of terminals that can transmit over the uplink at one time, however, since the number of data slots remains the same.

Referring again to FIG. 3, representative numbers that may be used with the present embodiment, but are not required, will now be discussed. An uplink bandwidth of 200 MegaHertz (MHz) may be used. The masterframe 302 may be approximately 0.75 seconds long and each frame 304 within the masterframe 302 may last approximately 92.4 milliseconds. The portion of the frame 304 allotted to time probe slots 306 may be approximately 3.24 milliseconds and traffic slots 308 may be approximately 89.01 milliseconds. If these numbers are used, then each time probe slot 306 may be about 131 microseconds long. In this example, there are 26 time probe slots 306 per frame 304 or 208 time probe slots 306 per masterframe 302.

Based on these exemplary numbers, in the present embodiment, less than 0.5% (1/208) of the time probe slots 306 are allocated to be empty. Because the time probe slots 306 are only a portion of the uplink, it is seen that the overall "loss" in bandwidth due to allocating blanking intervals is only about 0.018% of the total bandwidth (131 microseconds/0.75 seconds).

While particular elements, embodiments and applications of the present invention have been shown and described, it is understood that the invention is not limited thereto since modifications may be made by those skilled in the art, particularly in light of the foregoing teaching. It is therefore contemplated by the appended claims to cover such modifications and incorporate those features which come within the spirit and scope of the invention.

What is claimed is:

1. An apparatus for calibrating gain in satellite uplink receiver electronics, the apparatus comprising:
    an uplink receiver including an uplink signal output;
    a measurement processor, including a gain calibration output and an uplink signal input, coupled to said uplink signal output, said measurement processor further comprising sampling circuitry that samples uplink signals during a blanking interval;
    an attenuator coupled to said gain calibration output and said uplink signal output and including a calibrated signal output; and
    an analog to digital converter coupled to said calibrated signal output, wherein said converter is an analog to digital converter with approximately 42 dB of dynamic range.

2. An apparatus for calibrating gain in satellite uplink receiver electronics, the apparatus comprising:
    an uplink receiver including a uplink signal output;
    a measurement processor, including a gain calibration output and an uplink signal input, coupled to said uplink signal output, said measurement processor further comprising sampling circuitry that samples uplink signals during a blanking interval; and
    an atlenuator coupled to said gain calibration output and said uplink signal output and including a calibrated signal output;
    wherein said blanking interval is an empty slot of a TDMA uplink signal.

3. The apparatus of claim 2, wherein said empty slot is a time probe slot.

4. An apparatus for calibrating gain in satellite uplink receiver electronics, the apparatus comprising:
    an uplink receiver including an uplink signal output;
    a measurement processor, including a gain calibration output and an uplink signal input, coupled to said uplink signal output, said measurement processor further comprising sampling circuitry that samples uplink signals during a blanking interval; and
    an attenuator coupled to said gain calibration output and said uplink signal output and including a calibrated signal output;
    wherein said uplink signal output carries a time division multiplexed uplink signal.

5. The apparatus of claim 4 wherein said attenuator is a variable attenuator responsive to a gain calibration signal.

6. The apparatus of claim 4 wherein said measurement processor further comprises a snapshot buffer coupled to said uplink signal output.

7. The apparatus of claim 4 wherein said sampling circuitry is coupled to said uplink signal output and samples uplink signals periodically.

8. The apparatus of claim 7 wherein said sampling circuitry samples uplink signals at approximately thirty minute intervals.

9. An apparatus for calibrating gain in satellite uplink receiver electronics, the apparatus comprising:
    an uplink receiver including an, uplink signal output;
    a measurement processor, including a gain calibration output and an uplink signal input, coupled to said uplink signal output, said measurement processor further comprising sampling circuitry that samples uplink signals during a blanking interval; and
    an attenuator coupled to said gain calibration output and said uplink signal output and including a calibrated signal output;
    wherein said sampling circuitry is coupled to said uplink signal output and samples uplink signals periodically; and wherein said sampling circuitry samples uplink signals responsive to extreme changes in conditions.

10. An apparatus for calibrating gain in satellite uplink receiver electronics, the apparatus comprising:
    an uplink receiver including an uplink signal output;
    a measurement processor, including a gain calibration output and an uplink signal input, coupled to said uplink signal output, said measurement processor further comprising sampling circuitry that samples uplink signals during a blanking interval; and an attenuator coupled to said gain calibration output and said uplink signal output and including a calibrated signal output;

wherein said sampling circuitry is coupled to said uplink signal output and samples uplink signals multiple times during said blanking interval, and said measurement processor further comprises averaging circuitry coupled to said sampling circuitry, said averaging circuitry producing a sample average output signal on said gain calibration output, and wherein said attenuator is responsive to a sample average signal.

11. A method for calibrating gain in satellite uplink receiver electronics to reduce the dynamic range of processed uplink signals, the method comprising:

receiving an uplink signal during a scheduled blanking interval;

measuring gain associated with said uplink signal; and generating a calibrated signal by responsively controlling a variable attenuator in accordance with said gain to reduce dynamic range in subsequent uplink signals;

wherein said step of receiving comprises receiving during a scheduled empty time slot.

12. The method of claim 11 wherein said step of receiving comprises receiving during a scheduled time probe time slot.

13. The method of claim 11 wherein said measuring step further comprises measuring gain associated with receive path electronics.

14. The method of claim 13 wherein said step of measuring comprises measuring gain during a scheduled time probe time slot.

15. The method of claim 11 wherein said step of measuring gain comprises measuring gain during a scheduled empty time slot.

16. The method of claim 11 wherein said measuring step comprises measuring gain associated with receive path electronics.

17. The method of claim 11 wherein said measuring step measures gain periodically.

18. The method of claim 17 wherein said measuring step measures gain at approximately thirty minute intervals.

19. A method for calibrating gain in satellite uplink receiver electronics to reduce the dynamic range of processed uplink signals, the method comprising:

receiving an uplink signal during a scheduled blanking interval;

measuring gain associated with said uplink signal;

generating a calibrated signal by responsively controlling a variable attenuator in accordance with sad gain to reduce dynamic range in subsequent uplink signals; and allocating time probe slots to ground terminals.

20. A method for calibrating gain in satellite uplink receiver electronics to reduce the dynamic range of processed uplink signals, the method comprising:

receiving an uplink signal during a scheduled blanking interval;

measuring gain associated with said uplink signal;

generating a calibrated signal by responsively controlling a variable attenuator in accordance with said gain to reduce dynamic range in subsequent uplink signals;

wherein said measuring step comprises taking multiple gain samples of said uplink signal, averaging said multiple gain samples to produce a gain sample average, and wherein said step of generating calibrated signals comprises controlling said variable attenuator in accordance with said gain sample average.

21. A method for calibrating gain in satellite uplink receiver electronics to reduce the dynamic range of processed uplink signals, the method comprising:

receiving an uplink signal during a scheduled blanking interval;

measuring gain associated with said uplink signal;

generating a calibrated signal by responsively controlling a variable attenuator in accordance with said gain to reduce dynamic range in subsequent uplink signals;

wherein said measuring step measures gain periodically, and wherein said measuring step measures gain responsive to extreme changes in conditions.

22. An apparatus for calibrating gain in satellite uplink receiver electronics, the apparatus comprising:

means for receiving an uplink signal, including an uplink signal output;

means for measuring a gain, including a gain calibration output and an uplink signal input, coupled to said uplink signal output, said gain measuring means further comprising means for sampling uplink signals during a blanking interval;

attenuating means coupled to said gain calibration output and said uplink signal output for attenuating said uplink signal output and including a calibrated signal output; and means, coupled to said calibrated signal output, for converting a calibrated signal from analog to digital, wherein said converting means has approximately 42 dB of dynamic range.

23. An apparatus for calibrating gain in Satellite uplink receiver electronics the apparatus comprising:

means for receiving an uplink signal, including a uplink signal output;

means for measuring a gain including a gain calibration output and an uplink signal input, coupled to said uplink signal output, said gain measuring means further comprising means for sampling uplink signals during a blanking interval; and attenuating means coupled to said gain calibration output and said uplink signal output for attenuating said uplink signal output and including a calibrated signal output;

wherein said blanking interval is an empty slot of a TDMA uplink signal.

24. The apparatus of claim 23 wherein said empty slot is a time probe slot.

25. An apparatus for calibrating gain in satellite uplink receiver electronics, the apparatus comprising:

means for receiving an uplink signal, including an uplink signal output;

means for measuring a gain, including a gain calibration output and an uplink signal input, coupled to said uplink signal output, said gain measuring means further comprising means for sampling uplink signals during a blanking interval; and attenuating means coupled to said gain calibration output and said uplink signal output for attenuating said uplink signal output and including a calibrated signal output;

wherein said uplink signal output carries a time division multiplexed uplink signal.

26. The apparatus of claim 25 wherein said attenuating means is a variable attenuating means responsive to a gain calibration signal.

27. The apparatus of claim 25 wherein said sampling means is coupled to said uplink signal output and samples uplink signal periodically.

28. The apparatus of claim 27 wherein said sampling means samples uplink signals at approximately thirty minute intervals.

29. An apparatus for calibrating gain in satellite uplink receiver electronics, the apparatus comprising:

means for receiving an uplink signal, including an uplink signal output;

means for measuring a gain, including a gain calibration output and an uplink signal input, coupled to said uplink signal output, said gain measuring means further comprising means for sampling uplink signals during a blanking interval; and attenuating means coupled to said gain calibration output and said uplink signal output for attenuating said uplink signal output and including a calibrated signal output;

wherein said gain measuring means further comprises memory means for storing a gain measurement in memory and wherein said memory means is coupled to said uplink signal output.

30. An apparatus for calibrating gain in satellite uplink receiver electronics, die apparatus comprising:

means for receiving an uplink signal, including an uplink signal output;

means for measuring a gain, including a gain calibration output and an uplink signal input, coupled to said uplink signal output, said gain measuring means further comprising means for sampling uplink signals during a blanking interval; and attenuating means coupled to said gain calibration output and said uplink signal output for attenuating said uplink signal output and including a calibrated signal output;

wherein said sampling means is coupled to said uplink signal output and samples uplink signals periodically, and wherein said sampling means samples uplink signals responsive to extreme changes in conditions.

31. An apparatus for calibrating gain in satellite uplink receiver electronics, the apparatus comprising:

means for receiving an uplink signal including an uplink signal output;

means for measuring a gains, including a gain calibration output and an uplink signal input, coupled to said uplink signal output, said gain measuring means further comprising means for sampling uplink signals during a blanking interval; and attenuating means coupled to said gain calibration output and said uplink signal output for attenuating said uplink signal output and including a calibrated signal output;

wherein said sampling means is coupled to said uplink signal output and samples uplink signals multiple times during said blanking interval and said measuring means further comprises averaging means coupled to said sampling means, said averaging means producing a sample average output signal on said gain calibration output.

* * * * *